(12) United States Patent
Bonner

(10) Patent No.: US 10,485,309 B1
(45) Date of Patent: Nov. 26, 2019

(54) FINGER MOUNTABLE IMPLEMENT

(71) Applicant: Mark Bonner, Watertown, NY (US)

(72) Inventor: Mark Bonner, Watertown, NY (US)

( * ) Notice: Subject to any disclaimer, the term of this patent is extended or adjusted under 35 U.S.C. 154(b) by 0 days.

(21) Appl. No.: 15/381,434

(22) Filed: Dec. 16, 2016

(51) Int. Cl.
*A44C 9/00* (2006.01)
*B65D 43/02* (2006.01)
*A45F 5/00* (2006.01)
*H05K 5/02* (2006.01)

(52) U.S. Cl.
CPC ............ *A44C 9/0061* (2013.01); *A45F 5/00* (2013.01); *B65D 43/02* (2013.01); *H05K 5/0217* (2013.01)

(58) Field of Classification Search
CPC .................................................... B43K 23/012
USPC ........................................................ 401/6, 7
See application file for complete search history.

(56) References Cited

U.S. PATENT DOCUMENTS

| | | | |
|---|---|---|---|
| 2,002,144 A | 5/1935 | Heaton | |
| 2,511,557 A | 6/1950 | Arnold | |
| 2,728,932 A * | 1/1956 | Ramsey, Sr. | ............ B41K 1/006 |
| | | | 118/201 |
| 3,226,754 A | 1/1966 | Brittain | |
| 3,591,298 A | 7/1971 | Green | |
| D253,010 S | 9/1979 | Gueret et al. | |
| 4,177,698 A | 12/1979 | Greneker | |
| D254,035 S | 1/1980 | Gueret et al. | |
| 4,213,472 A | 7/1980 | Gueret et al. | |
| 4,621,935 A | 11/1986 | Sussman | |
| 4,915,234 A | 4/1990 | Boeller | |
| D339,235 S | 9/1993 | Hirzel | |
| 5,944,434 A | 8/1999 | Schlatter | |
| 6,116,252 A * | 9/2000 | Stelmach | ............ A46B 15/0071 |
| | | | 132/309 |
| 6,626,598 B2 * | 9/2003 | Schneider | ............ B43K 23/012 |
| | | | 401/258 |
| 6,634,367 B2 * | 10/2003 | Abraham | ............ A45D 29/004 |
| | | | 132/285 |
| 7,214,336 B2 | 5/2007 | Sheridan et al. | |
| 8,662,091 B2 | 3/2014 | Jang | |
| 2009/0101163 A1 | 4/2009 | Brunner | |
| 2011/0142528 A1 | 6/2011 | Charlton | |

* cited by examiner

*Primary Examiner* — David J Walczak
*Assistant Examiner* — Joshua R Wiljanen
(74) *Attorney, Agent, or Firm* — Dennis B. Danella, Esq.; Woods Oviatt Gilman LLP

(57) ABSTRACT

A finger mountable implement comprising a body defining an open interior space. The body comprises a side wall having an open bottom end and an open top end, and a top panel proximate to the open top end. An interior surface of the side wall includes a figured finger grip portion configured to releasably engage a finger of a user when the finger is inserted into the interior space so as to removably secure the finger within the body.

18 Claims, 7 Drawing Sheets

FINGER MOUNTABLE IMPLEMENT

FIELD OF THE INVENTION

The present invention relates to a finger mountable implement; and more particularly, to a finger mountable implement having an internal surface adapted to improve user grip when employing the implement.

BACKGROUND OF THE INVENTION

Consumer goods come in all sorts of packaging, including some designed to be handled by an individual during use. By way of example, cosmetics come in a variety of formulations, including loose powders, compact powders, and polymer/wax dispersions (such as lip sticks, lip balms or lip gloss, and generally referred to herein as lip balm). Typically, lip balm dispensers include an applicator generally shaped as a tubular container with an open top end through which a user can extract the lip balm therefrom. The opposing second end of the applicator is generally closed to and may include a screw-type mechanism to advance the lip balm within the container as the lip balm is consumed by the user.

When using traditional lip balms, an individual holds the outer surface of the tubular container using a pinching grip with his or her fingers as he or she applies the lip balm in a sweeping or dabbing motion. As a result, should the individual lose control of the applicator, the lip balm may not spread properly or may spread where not intended; a result undesirable if the lip balm is a vividly colored lip stick that may be difficult to remove from an individual's clothing or skin (particularly should other cosmetics already be applied to the individual).

In a further example, candy is frequently packaged in dispensing containers. To access the candy within, individuals (typically children) must manipulate the packaging, such as removing wrappers. As a result of this manipulation, a child's hands, fingers or face may engage a portion of the candy such that the candy is transferred to the child making the child's hands, fingers and/or face dirty and possibly sticky.

Therefore, there is a need for a finger mountable implement which affords an individual improved control over the finger mountable implement. The present invention addresses this as well as other needs.

BRIEF SUMMARY OF THE INVENTION

It is, therefore, an aspect of the present invention to provide a finger mountable implement comprising a body defining an open interior space, wherein the body comprises a side wall having an open bottom end and an open top end, and a top panel proximate to the open top end. An interior surface of the side wall includes a finger grip portion configured to releasably engage a finger of a user when the finger is inserted into the interior space so as to removably secure the finger within the body.

In a further aspect of the present invention, the top panel is not coterminous with the open top end, thereby defining a receiving space between the top panel and open top end. A volume of the receiving space may be, for example, between about 1 percent and about 10 percent of a volume of the interior space and a cap may be configured to be releasably secured to the body and extend a distance above the open top end so as to cover the receiving space while permitting the material to remain extended outwardly beyond the open top end when the cap is secured. The open interior space may also have a length which, when the finger resides with the open interior space, the bottom end is positioned between a distal interphalangeal joint and a proximate interphalangeal joint of the finger.

In still another aspect of the present invention, the finger grip portion may be comprised of the interior surface having a convex profile extending into the open interior space. The convex profile may extend between the top panel and the open bottom end or may extend an intermediate distance, or a portion of a distance, between the top panel and the open bottom end. Alternatively or additionally, the finger grip portion may comprise an annular ring defined on the interior surface and extending into the open interior space, or may be a plurality of annular rings in spaced parallel relation defined on the interior surface and extending into the open interior space. Still further, the finger grip portion may comprise a plurality of nodules defined on the interior surface an extending into the open interior space.

Additional aspects, advantages and novel features of the present invention will be set forth in part in the description which follows, and will in part become apparent to those in the practice of the invention, when considered with the attached figures.

BRIEF DESCRIPTION OF THE DRAWINGS

The accompanying drawings form a part of this specification and are to be read in conjunction therewith, wherein like reference numerals are employed to indicate like parts in the various views, and wherein.

DETAILED DESCRIPTION OF THE INVENTION

Figure 1:
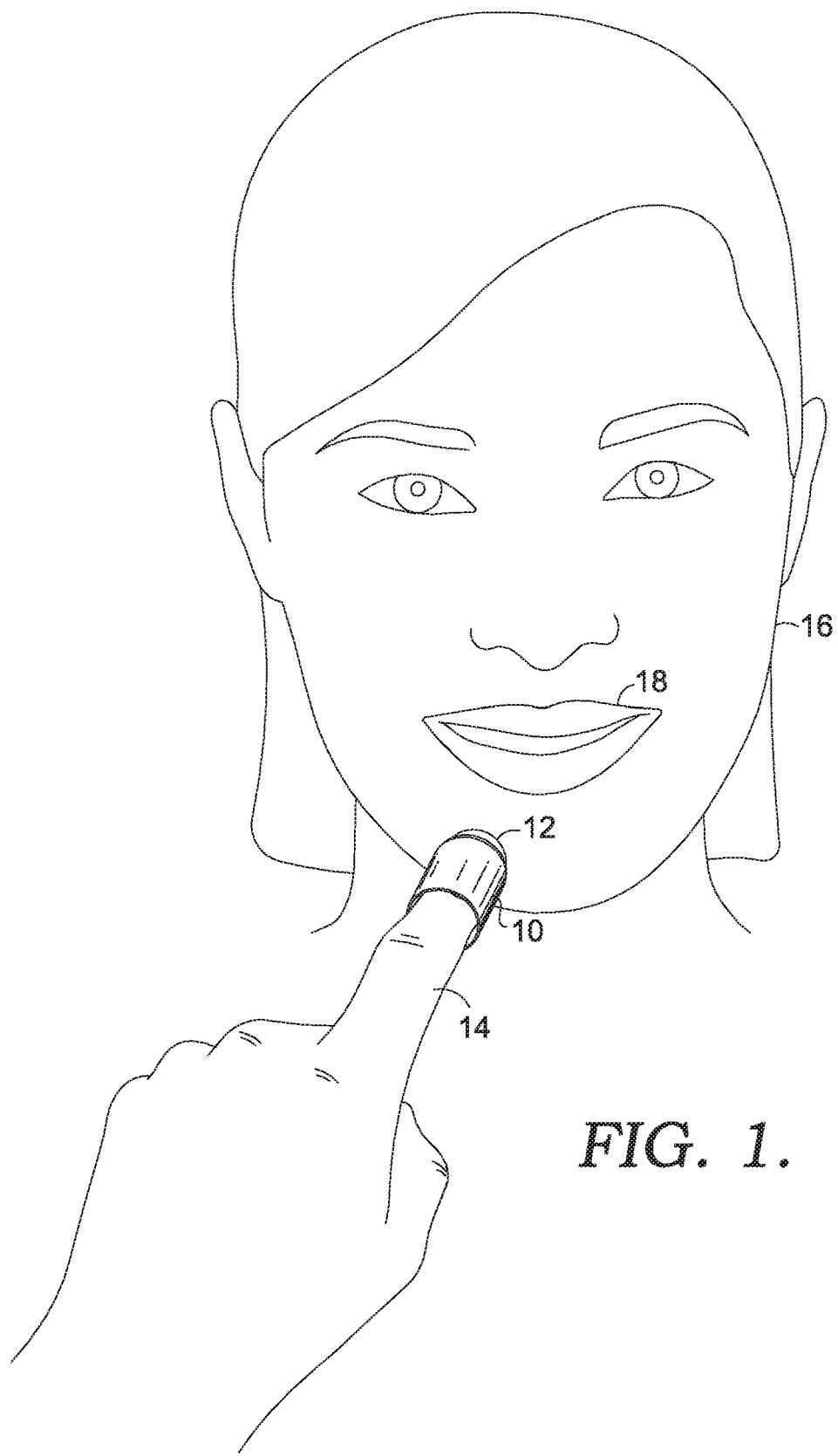
FIG. 1 is a perspective view of a finger mountable implement in accordance with an aspect of the present invention mounted upon a user's finger.

With reference to FIGS. 1-5 and 9, a finger mountable implement 10 is disclosed. Finger mountable implement 10 may be configured to receive a material 12 which may be any suitable material, such as but not limited to, a cosmetic, candy, or an adhesive such as glue. In a further aspect of the invention, the finger mountable implement, such as a body 20, may be configured to receive, or be coupled to, one or more electronic devices 12a such as switches, pressure sensors, accelerometers, transceivers and the like which may communicate finger position and contact to a remote receiver, such as a computing device. In view of the above and by way of example and by no means limited solely thereto, finger mountable implement 10 may be particularly designed for the application of lip-based cosmetics, such as but not limited to lip sticks, lip balms or lip gloss (generally referred to herein as lip balm). In accordance with an aspect of the present invention and continuing the above example, finger mountable implement 10 may be mounted onto, and extend outwardly from, a finger 14 of user 16 so that user 16 may apply cosmetic material 12, such as to his or her lips 18. While shown as being mounted onto the index finger of user 16, finger mountable implement 10 may be mounted onto any desired finger.

With specific reference to FIGS. 2-5, finger mountable implement 10 may include a cylindrical body 20 comprising a side wall 22 having an open bottom end 24 and an open top end 26, and a top panel 28 proximate open top end 26. Side wall 22 has an exterior surface 30 and an interior surface 32 defining an interior space 34. Top panel 28 may be spaced an intermediate distance D from top end 26 thereby defining a receiving space 36. Material 12 may extend outwardly beyond the plane created by top end 26 (see FIGS. 1 and 6-9) whereby a user may insert finger 14 into interior space 34 and engage material 12, such as applying cosmetic material to lips 18.

Figure 3:
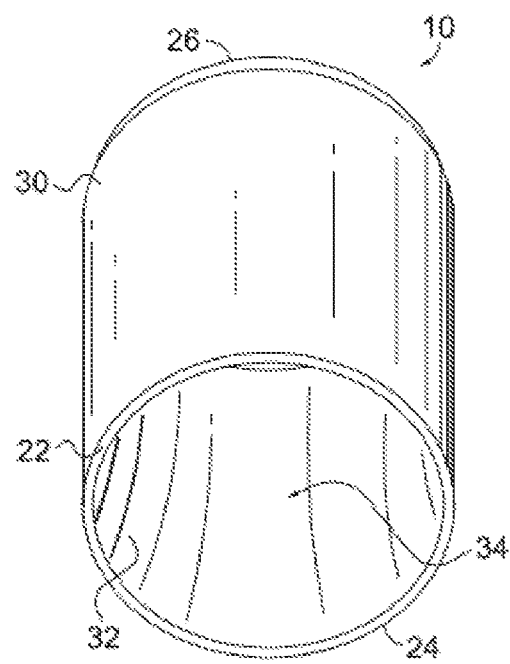
FIG. 3 is bottom perspective view of an aspect of a finger mountable implement in accordance with the present invention.
Figure 4:
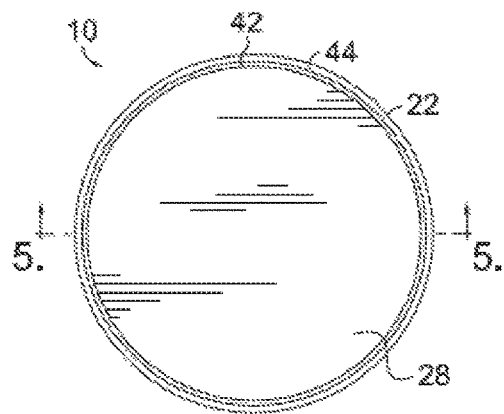
FIG. 4 is top view of the finger mountable implement shown in FIG. 1.
Figure 4A:
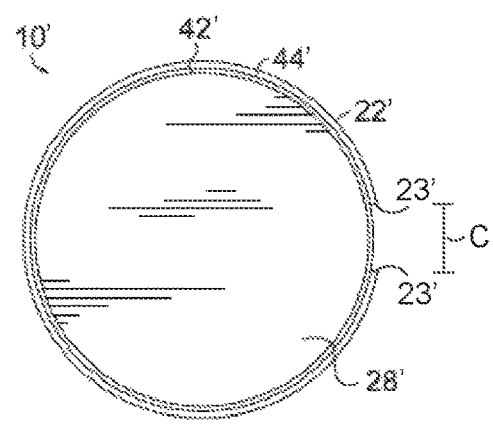
FIG. 4A is a top view of a finger mountable implement is accordance with a further aspect of the present invention.

As shown in FIG. 4A, in accordance with a further aspect of the present invention, a finger mountable implement 10' may include a side wall 22' configured to include side wall edges 23' which define a channel C within side wall 22'. The dimensions of channel C may be selected to enable flexure of side wall 22' while also ensuring retention of finger 14 within finger mountable implement 10'. In accordance with a further aspect, channel C may extend from the open bottom end to the open top end of finger mountable implement 10' (see e.g., FIGS. 2 and 3) or an intermediate distance from either end. Still further, channel C may be configured to reside within the body of side wall 22' and not terminate at either the open bottom end or open top end. It should be further noted that the circumferential width of channel C within side wall 22' may extend a substantial circumference of side wall 22', with such channel C width being limited by the need to retain finger mountable implement 10' onto finger 14. By way of example, channel C may have a width less than one-thirty-seconds inch (1/32") or may encompass up to fifty percent (50%) of the side wall circumference.

Figure 4B:
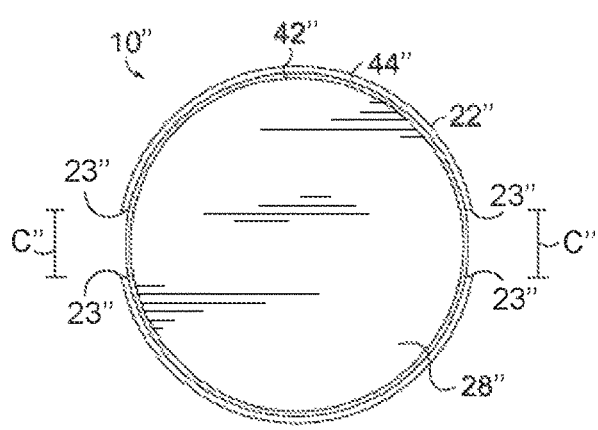
FIG. 4B is a top view of a finger mountable implement is accordance with another aspect of the present invention.

FIG. 4B shows an alternative finger mountable implement 10" in accordance with an aspect of the present invention. Finger mountable implement 10" may include a side wall 22" configured to include a plurality of side wall edges 23" which define two or more channels C" within side wall 22". Similar to finger mountable implement 10' described above (FIG. 4A), the dimensions of channels C" may be selected to enable flexure of side wall 22" while also ensuring retention of finger 14 within finger mountable implement 10". In accordance with a further aspect, channels C" may extend from the open bottom end to the open top end of finger mountable implement 10" (see e.g., FIGS. 2 and 3) or an intermediate distance from either end. Still further, channels C" may be configured to reside within the body of side wall 22" and not terminate at either the open bottom end or open top end. It should be further noted that the circumferential width of channels C" within side wall 22" may or may not be same width with each other respective channel C". Respective channels C" may or may not also be radially aligned with respect to one another along the circumference of side wall 22".

Figure 2:
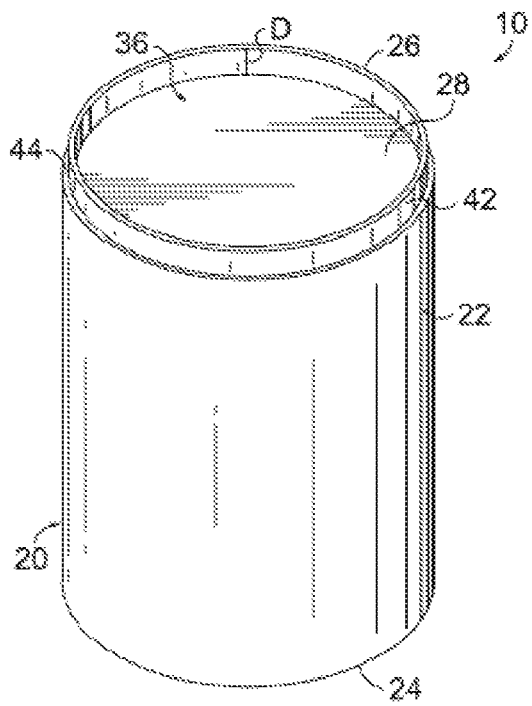
FIG. 2 is a top perspective view of a finger mountable implement in accordance with an aspect of the present invention.
Figure 6:
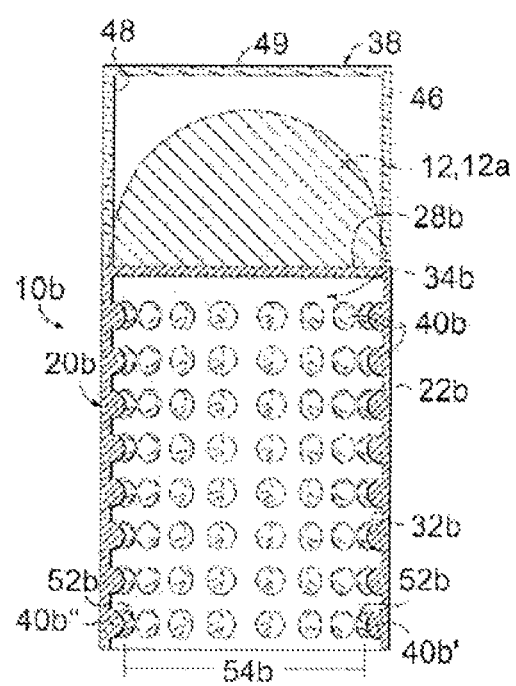
FIG. 6 is a cross section view of an alternative aspect of a finger mountable implement in accordance with the present invention, wherein the finger mountable implement further includes an optional cap.
Figure 7:
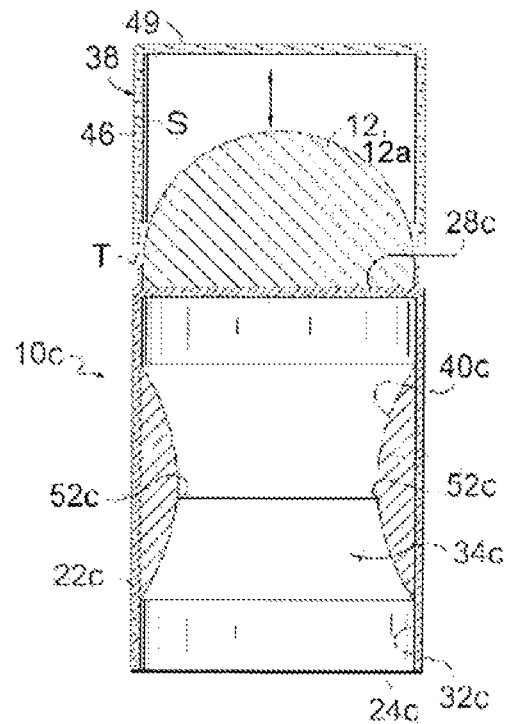
FIG. 7 is a cross section view of another alternative aspect of a finger mountable implement in accordance with the present invention.

As shown in FIGS. 6 and 7, an optional removable cap 38 may be configured to be releasably coupled to body 20, such as through a friction fit, snap fit, threaded connection or the like. To that end, top end 26 may have a stepped profile wherein terminal portion 42 of top end 26 has a narrower wall thickness than the remainder of side wall 22 so as to form a step 44 (see FIGS. 2 and 4). Cap 38 may include a downwardly extending side wall 46 proportioned so that the inner surface 48 of side wall 46 matingly engages terminal portion 42 so as to releasably secure cap 38 to body 20 as described above. Side wall 46 may have a length S such that, when cap 38 is secured to body 20, cap top 49 does not impact material 12 resident within, and extending outwardly from, receiving space 36 (FIG. 2). Side wall 46 of cap 38 may also have a wall thickness T which is selected to be substantially the same as width W of step 44. In this manner, cap 38 may be secured onto body 20 so that side wall 46 of cap 38 is flush with side wall 22 of body 20.

Figure 5:
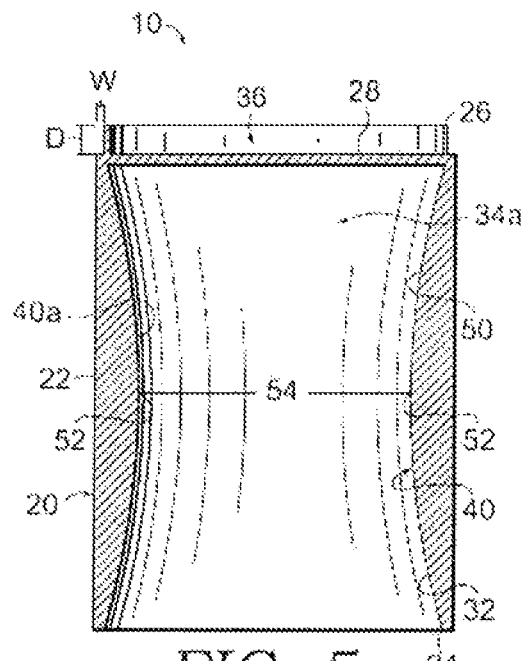
FIG. 5 is a cross section view of the finger mountable implement shown in FIG. 3 and taken generally along line 5-5 in FIG. 4.
Figure 9:
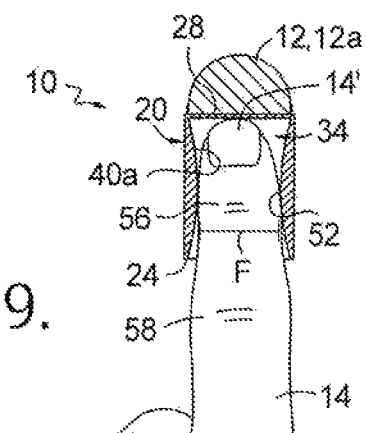
FIG. 9 is an environmental view of the finger mountable implement shown in cross section in FIG. 5 mounted upon a user's finger.

To facilitate capture and retention of finger 14 within interior space 34, interior surface 32 may be configured to include a figured finger grip portion 40. As shown in FIGS. 3, 5 and 9, one aspect of a finger grip portion 40a may comprise interior surface 32 configured to form a body inner wall 50, which includes a convex cross-sectional profile. It should be understood that the surface curvature may extend substantially from top panel 28 to bottom end 24, or may extend a portion of a distance between top panel 28 and bottom end 24. Further, finger grip portion 40a may be formed around the entire inner circumference of inner surface 32, or may be formed in a portion of the inner circumference of inner surface 32. The radius of curvature of body inner wall 50 may be selected such that the apex 52 of curvature defines a narrowed interior space opening 54 which is substantially equal to or slightly smaller than the thickness F of finger 14 (see FIG. 9). In this manner, when finger 14 fully resides within interior space 34 such that fingertip 14' is immediately adjacent top panel 28, apex 52 of body inner wall 50 snuggly engages finger 14 proximate to the distal interphalangeal joint 56 so as to become compressed or snuggly fit against the bones (not shown) on either side of distal interphalangeal joint 56. Body 20 and interior space 34 defined therein may also be selected to have a length which, when finger 14 fully resides with interior space 34 as described above, bottom end 24 is positioned substantially even with distal interphalangeal joint 56, or between distal interphalangeal joint 56 and proximate interphalangeal joint 58, so as to permit flexure of proximate interphalangeal joint 58 without substantially impacting digital dexterity of finger 14.

Figure 8:
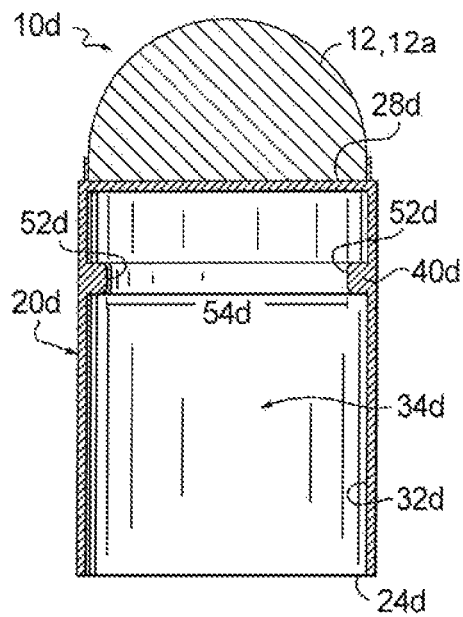
FIG. 8 is a cross section view of still another alternative aspect of a finger mountable implement in accordance with the present invention.

Turning now to FIGS. 6-8, examples of alternative aspects of finger mountable implements 10b-10d having finger grip portion 40b-40d, respectively, are shown. While FIGS. 6-8 show specific examples of alternative finger grip portions, it should be understood by those skilled in the art that still further embodiments of finger grip portions may be produced in accordance with the teachings of the present invention and that such additional alternative embodiments are to be considered part of the instant disclosure. By way of example and by no means limiting solely thereto, figured finger grip portion 40 may be configured to include gripping features arranged in vertical, horizontal, diagonal or diamond arrays, with non-limiting representative embodiments of selected configurations being shown and described below.

Referring now to FIG. 6, interior surface 32b of side wall 22b of body 20b may include a plurality of nodules 40b extending outwardly from interior surface 32b and into interior space 34b. Nodules 40b may be formed of any shape and in an exemplary embodiment shown in FIG. 6, nodules 40b may be generally semi-spherical domes or other shapes. For example, the diameter and radius of curvature of the semi-spherical domes may be selected such that distance between apex 52b of opposing domes (such as nodules 40b'/40b") defines a narrowed interior space opening 54b which is substantially equal to or slightly smaller than the thickness F of finger 14. Nodules 40b may be regularly spaced apart in a pattern, such as that shown in FIG. 6, or may be arranged in any random layout. Additionally, nodules 40b may extend over substantially the entire interior surface 32b, such as that shown in FIG. 6, or may be selectively positioned on interior surface 32b along only a portion of interior surface 32b. For example, nodules 40b may extend over a portion of interior surface 32b that is anticipated to engage distal interphalangeal joint 56 so as to form a snug fit with the finger joint while not requiring the user to slide joint 56 and associated skin and bones across nodules which will not be the primary nodules used to secure the finger in interior space 34b when the finger is in its fully resident position in finger mountable implement 10b.

Referring now to FIG. 7, finger mountable implement 10c may include an interior surface 32 of side wall 22c of body 20c having a finger grip portion 40c which includes a convex cross-sectional profile wherein the surface curvature extends an intermediate distance, or a portion of the distance, between top panel 28c to bottom end 24c and extends outwardly from interior surface 32c and into interior space 34c. The diameter and radius of curvature of finger grip portion 40c may be selected such that distance between opposing apexes 52c defines a narrowed interior space opening 54c which is substantially equal to or slightly smaller than the thickness F of finger 14 as described above. Finger grip portion 40c may also be selectively positioned on interior surface 32c along that portion of the surface which is anticipated to engage distal interphalangeal joint 56 so as to form a snug fit with the finger joint as described above.

Referring now to FIG. 8, finger mountable implement 10d may include an interior surface 32d of side wall 22d of body 20d having a finger grip portion comprised of an annular ring 40d located at bottom end 24d, or at a distance or position between top panel 28d to bottom end 24d. Annular ring 40d extends outwardly from interior surface 32d and into interior space 34d. The diameter and radius of curvature of finger grip portion 40d may be selected such that distance between opposing apexes 52d defines a narrowed interior space opening 54d which is substantially equal to or slightly smaller than the thickness F of finger 14 as described above. Finger grip portion 40d may also be selectively positioned on interior surface 32d along that portion of the surface which is anticipated to engage distal interphalangeal joint 56 so as to form a snug fit with the finger joint as described above. Further, finger grip portion 40d need not extend around the entire inner circumference of inner surface 32d, and could only extend around a portion of the inner circumference of inner surface 32d. It should be further noted that, while shown and described as a single annular ring 40d, an alternative embodiment of finger mountable implement 10e may include an interior surface 32e having a plurality of annular rings 40e in spaced parallel relation to one another along interior surface 32e, which is described below with reference to FIG. 8A.

Figure 8A:
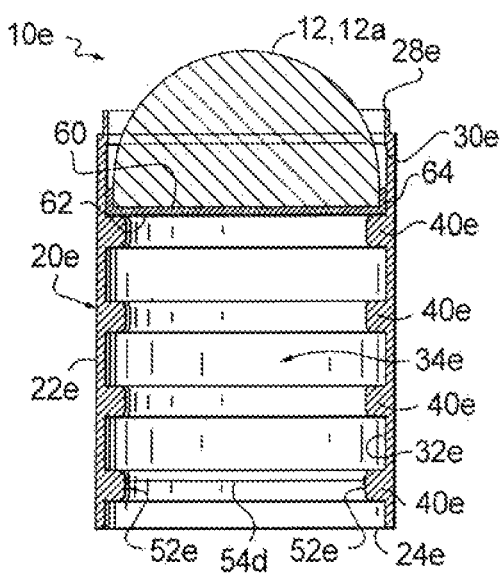
FIG. 8A is a cross section view of an alternative aspect of a finger mountable implement in accordance with the present invention.

Referring now to FIG. 8A, finger mountable implement 10e may include an interior surface 32e of side wall 22e of body 20e having a finger grip portion comprised of a plurality of annular rings 40e in spaced parallel relation to one another along interior surface 32e. Each annular ring 40e may extend outwardly from interior surface 32e and into interior space 34e similar to annular ring 40d described above with reference to FIG. 8. Similarly, the diameter and radius of curvature of each finger grip portion 40e may be selected such that distance between opposing respective apexes 52e defines a narrowed interior space opening 54e which is substantially equal to or slightly smaller than the thickness F of finger 14 as described above. In this manner, the plurality of annular rings 40e may enable interior surface 32e to engage distal interphalangeal joint 56 at one of a plurality of locations so as to form a snug fit with the finger joint as described above. Body 20e may further define an open bottom end 24e and an open top end 28e, with side wall 22e including a stepped ledge 30e proximate open top end 28e.

It should be noted that in each of the above examples, finger grip portions 40-40e may be rigid members fabricated from suitable materials, such as a rigid plastic or metal, or may be fabricated from a resilient and/or flexible material, such as but not limited to one or more of a gel, synthetic foam, natural or artificial rubbers and the like.

A tray 60 may be configured to reside within interior space 34e between stepped ledge 30e and the top-most annular ring 40e as shown in FIG. 8A. Tray 60 may include a tray bottom 62 and an upwardly extending tray wall 64. Tray wall 64 may be dimensioned so that tray wall 64 does not extend the entire length between stepped ledged 30e and top-most annular ring 40e. Tray wall 64 may further snuggly engage interior surface 32e, such as through a friction fit, whereby tray 60 may then translate within body 20e upon outward pushing of tray bottom 62 using finger 14. Translation of tray 60 may then cause successive amounts of material 12 to pass outwardly from open top end 28e. Tray 60 may translate until tray wall 64 impacts stepped ledge 30e whereby further travel is prevented. While tray 60 has been shown and described as translating linearly through application of a pushing force, alternative means of translation are to be considered within the teachings of the present invention, including but not limited to a threaded advancement mechanism and the like.

Figure 10:
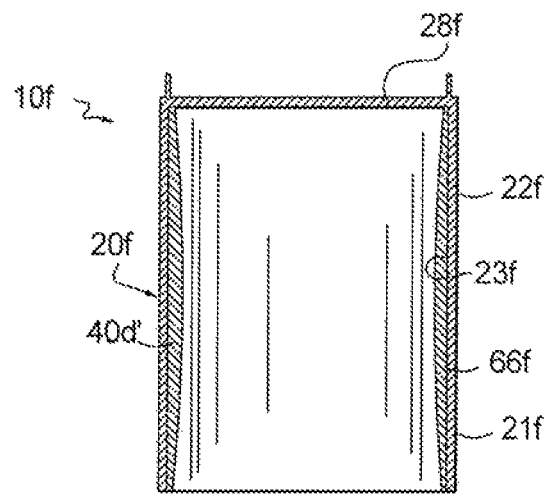
FIG. 10 is a cross section view of yet another alternative aspect of a finger mountable implement in accordance with the present invention.
Figure 11:
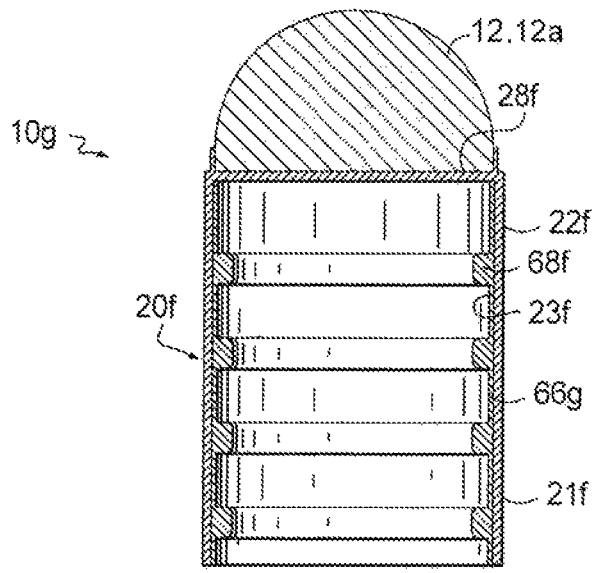
FIG. 11 is a cross section view of another alternative aspect of a finger mountable implement in accordance with the present invention.

Turning now to FIGS. 10 and 11, further alternative aspects of finger mountable implements 10f and 10g are shown. Each finger mountable implement 10f, 10g may include a body 20f configured to be a two-piece construction. A rigid outer portion 21f may include outer side wall portion 22f and top panel 28f as described above. Outer side wall portion 22f may also be configured to define a channel similar to channel C described above with reference to FIG. 4A. Outer side wall portion 22f may include a planar inner surface 23f configured to receive an inner side wall portion 66f, 66g, respectively. Inner side wall portion 66f, 66g may also be configured to define a generally closed cylinder or may be configured to include a channel similar to channel C, with such configurations being independent from the configuration of outer side wall portion 22f.

By way of example, outer side wall portion 22f may include a channel while inner side wall potion 66f, 66g may define a closed cylinder; outer side wall portion 22f may include a channel while inner side wall portion 66f, 66g may define a channel which coincides with the outer side wall portion channel; outer side wall portion 22f may include a channel while inner side wall portion 66f, 66g defines a channel which does not coincide with the outer side wall portion channel; or outer side wall portion 22f may not include a channel while inner side wall portion 66f, 66g defines a channel. Furthermore, as described above with reference to FIG. 4A, each respective channel may extend from the open bottom end to the open top end; extend an intermediate distance from either the open bottom end or open top end; or may reside within the side wall portion body between, and without terminating at, either the open bottom end or the open top end.

As shown in FIG. 10, inner side wall portion 66f may define a finger grip portion 40f which includes a convex cross-sectional profile similar to finger mountable element 10 described above with reference to FIGS. 2-5. A further example is shown in FIG. 11 wherein inner side wall portion 66g may define a finger grip portion 40g which includes a plurality of annular rings 68g similar to annular rings 40e described above with regard to FIG. 8A. In this manner, outer side wall portion 22f and top panel 28f may be rigid members fabricated from suitable materials, such as a rigid plastic or metal while finger grip portions 40f, 40g may be fabricated from a resilient and/or flexible material, such as but not limited to one or more of a gel, synthetic foam, natural or artificial rubbers and the like. It should be noted that finger grip portions 40f and 40g are representative examples of figured inner side wall portions and other and additional configurations may be used in accordance with the present invention, such as but not limited to similar profiles shown in FIGS. 6-8.

Figure 12:
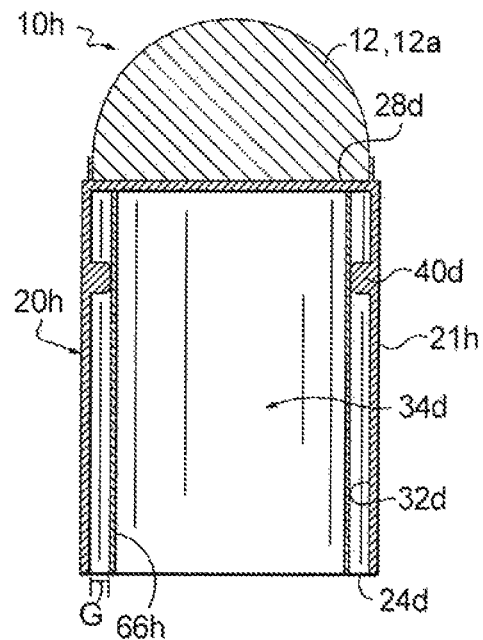
FIG. 12 is a cross section view of still another alternative aspect of a finger mountable implement in accordance with the present invention.

FIG. 12 shows a further aspect of the present invention wherein finger mountable implement 10h may include a body 20h configured to be a two-piece construction. However, in the case of finger mountable implement 10h, rigid outer portion 21h may be configured to include a sidewall similar to embodiments 10-10e described above. By way of example FIG. 12 shows a finger mountable implement 10h incorporated finger mountable implement 10d described above and having an interior surface 32d having a finger grip portion comprised of an annular ring 40d located at bottom end 24d, or at a distance or position between top panel 28d to bottom end 24d. Annular ring 40d extends outwardly from interior surface 32d and into interior space 34d. Finger mountable implement 10h may further include an inner side wall portion 66h. Inner side wall portion 66h may be a tubular member spaced apart from outer portion 21h a gap distance G, but may contact or be fixedly secure to annular ring 40d. Inner side wall portion may be a resilient and/or flexible material configured to conform to at least a portion of interior surface 32d when a finger F is inserted therein. Again, it should be noted that interior surface 32d shown in FIG. 12 is a representative example and other and additional configurations may be used in accordance with the present invention, such as but not limited to similar profiles shown in FIGS. 1-7 and 8A.

Figure 13:
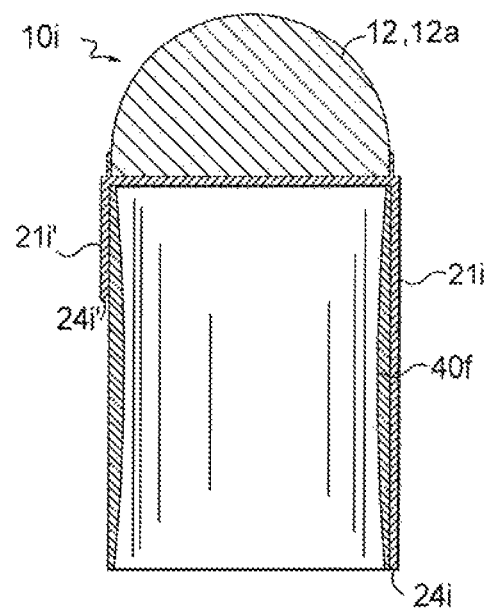
FIG. 13 is a cross section view of another alternative aspect of a finger mountable implement in accordance with the present invention.

Turning now to FIG. 13, a further alternative aspect of a finger mountable implement 10i is shown. Finger mountable implement 10i is similar to finger mountable implement 10f described above with the only difference being that outer portion 21i includes a portion 21i' that is shorter than the remainder that outer portion 21i thereby defining a bottom end 24i' that is a spaced distance above bottom end 24i of outer portion 21i. A finger grip portion, such as finger grip portion 40f may reside with outer portion 21i as described above. Again, it should be noted that finger grip portion 40f is representative a example of a figured inner side wall portion and other and additional configurations may be used in accordance with the present invention, such as but not limited to similar profiles shown in FIGS. 6-8A.

The foregoing description of the preferred embodiment of the invention has been presented for the purpose of illustration and description. It is not intended to be exhaustive nor is it intended to limit the invention to the precise form disclosed. It will be apparent to those skilled in the art that the disclosed embodiments may be modified in light of the above teachings. The embodiments described are chosen to provide an illustration of principles of the invention and its practical application to enable thereby one of ordinary skill in the art to utilize the invention in various embodiments and with various modifications as are suited to the particular use contemplated. Therefore, the foregoing description is to be considered exemplary, rather than limiting, and the true scope of the invention is that described in the following claims.

What is claimed is:

1. A finger mountable implement comprising:
   a body defining an open interior space, the body comprising a side wall having an open bottom end and an open top end, and a top panel proximate to the open top end; and
   a cap configured to be releasably secured to the body, wherein the cap covers the open top end,
   wherein the side wall includes an interior surface, wherein at least a portion of the interior surface includes a figured finger grip portion configured to releasably engage a finger of a user when the finger is inserted into the open interior space to removably secure the finger within the body, and wherein an electronic device is coupled to the body.

2. The finger mountable implement in accordance with claim 1, wherein the top panel is not coterminous with the open top end, wherein a receiving space is defined between the top panel and open top end, the receiving space configured to receive a material therein.

3. The finger mountable implement in accordance with claim 2, wherein the cap extends a distance above the open top end to cover the receiving space while permitting the material to remain extended outwardly beyond the open top end when the cap is secured.

4. The finger mountable implement in accordance with claim 1, wherein the open interior space has a length which, when the finger resides within the open interior space, the open bottom end is positioned between a distal interphalangeal joint of the finger and a proximate interphalangeal joint of the finger.

5. The finger mountable implement in accordance with claim 1, wherein the finger grip portion is comprised of the interior surface having a convex profile extending into the open interior space.

6. The finger mountable implement in accordance with claim 5, wherein the interior surface includes an inner circumference, and wherein the convex profile extends along a portion of the inner circumference.

7. The finger mountable implement in accordance with claim 1, wherein the finger grip portion comprises an annular ring defined on the interior surface, wherein the annular ring extends into the open interior space.

8. The finger mountable implement in accordance with claim 7, wherein the interior surface includes an inner circumference, and wherein the annular ring extends along a portion of the inner circumference.

9. The finger mountable implement in accordance with claim 1, wherein the finger grip portion comprises a plurality of annular rings defined on the interior surface in spaced parallel relation, wherein each of the plurality of annular rings extends into the open interior space.

10. The finger mountable implement in accordance with claim 1, wherein the finger grip portion comprises a plurality of nodules defined on the interior surface, wherein each of the plurality of nodules extends into the open interior space.

11. The finger mountable implement in accordance with claim 1, wherein the side wall is configured to include at least one channel defined therein.

12. The finger mountable implement in accordance with claim 1, wherein the side wall comprises an outer side wall portion and a coaxially aligned inner side wall portion.

13. The finger mountable implement in accordance with claim 12, wherein the outer side wall portion defines the figured finger grip portion and the inner side wall portion contours to the figured finger grip portion.

14. The finger mountable implement in accordance with claim 12, wherein the outer side wall portion defines the figured finger grip portion and the inner side wall portion is spaced apart from the figured finger grip portion.

15. The finger mountable implement in accordance with claim 12, wherein the outer side wall portion is configured to include a planar inner wall and the inner side wall portion is configured to define the figured finger grip portion.

16. The finger mountable implement in accordance with claim 12, wherein the outer side wall portion is constructed of a rigid material and the inner side wall portion is constructed from at least one of a resilient or flexible material.

17. The finger mountable implement in accordance with claim 12, wherein one or both of the outer side wall portion and the inner side wall portion is configured to include at least one channel defined therein.

18. A finger mountable implement comprising a body defining an open interior space, wherein an electronic device is coupled to the body, the body comprising:
   a) a side wall having an open bottom end and an open top end and defining a stepped ledge proximate the open top end, the side wall including an interior surface having a finger grip portion configured to releasably engage a finger of a user when the finger is inserted into the open interior space; and
   b) a tray resident within the open interior space and having a tray bottom and tray sidewall, the tray being selectively moveable within the interior space.

* * * * *